(12) United States Patent
Nakazawa (10) Patent No.: US 8,525,578 B2
(45) Date of Patent: Sep. 3, 2013

(54) SEMICONDUCTOR DEVICE HAVING PLURAL OPTICAL FUSES AND MANUFACTURING METHOD THEREOF

(75) Inventor: Shigeyuki Nakazawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 37 days.

(21) Appl. No.: 13/358,366

(22) Filed: Jan. 25, 2012

(65) Prior Publication Data

US 2012/0194260 A1   Aug. 2, 2012

(30) Foreign Application Priority Data

Jan. 31, 2011   (JP) ................................. 2011-018385

(51) Int. Cl.
  *H01H 37/76*   (2006.01)
(52) U.S. Cl.
  USPC .......................................................... 327/525
(58) Field of Classification Search
  USPC .......................................... 327/524, 525, 526
  See application file for complete search history.

(56) References Cited

U.S. PATENT DOCUMENTS

| 7,652,521 B2 * | 1/2010 | Hashimoto | 327/525 |
| 7,935,941 B2 * | 5/2011 | Bruland et al. | 438/662 |
| 8,217,710 B2 * | 7/2012 | Bae | 327/525 |

FOREIGN PATENT DOCUMENTS

JP   07-273200 A   10/1995

* cited by examiner

*Primary Examiner* — Jeffrey Zweizig
(74) *Attorney, Agent, or Firm* — Sughrue Mion, PLLC (57) ABSTRACT

Such a device is disclosed that includes a first ladder fuse for which blowing points are arranged at a first coordinate and a second ladder fuse for which blowing points are arranged at a second coordinate. When adjustment data for adjusting circuit characteristics is within a first range, a trimming operation is performed on both the first and second ladder fuses, and when the adjustment data for adjusting the circuit characteristics is within a second range, the trimming operation is performed on the second ladder fuse without performing the trimming operation on the first ladder fuse. This configuration eliminates a necessity of irradiation on the first ladder fuse with a laser when the adjustment data is within the second range.

24 Claims, 10 Drawing Sheets

SEMICONDUCTOR DEVICE HAVING PLURAL OPTICAL FUSES AND MANUFACTURING METHOD THEREOF

BACKGROUND OF THE INVENTION

1. Field of the Invention

The present invention relates to a semiconductor device and a manufacturing method thereof, and more particularly relates to a semiconductor device including a plurality of optical fuses for storing adjustment data for adjusting circuit characteristics and a manufacturing method thereof.

2. Description of Related Art

Some semiconductor devices require an adjustment of circuit characteristics by performing fuse trimming in its manufacturing stage. The fuse trimming is performed in a so-called on-the-fly method. For example, in the on-the-fly method, a plurality of optical fuses arranged on an X-axis are selectively blown or trimmed while scanning a laser irradiation position or a semiconductor device on a semiconductor wafer itself in an X-axis direction while a Y-axis is being fixed. Specifically, a laser trimmer emits a laser beam at a timing when the laser irradiation position is right on an X-coordinate of a target optical fuse to blow. A desired optical fuse is thereby blown. When scanning for the designated Y-coordinate is completed, the laser irradiation position is moved to another Y-coordinate, and scanning is performed again in the X-axis direction. The fuse trimming by the on-the-fly method is performed after adjusting or aligning positions of the laser irradiation position with respect to the semiconductor device on the semiconductor wafer. As the number of times of changing the Y-coordinate of the laser irradiation position or the semiconductor device on the semiconductor wafer increases, the proportion of time for moving the Y-axis in a total blowing time of the optical fuse increases, resulting in an increase of the time required for the trimming. In addition, if the number of movements causes a necessity for performing realignment of the laser irradiation position with respect to the semiconductor wafer, the time required for the trimming is further increased.

Meanwhile, the adjustment range of a certain circuit characteristics by the fuse trimming is closely related to the manufacturing maturity level of the semiconductor device. This is because the necessary adjustment range is different between a test production stage with a low maturity level and a mass production stage with a high maturity level. For example, if a characteristic design value of the certain circuit is set at "5" and an adjustable range by the fuse trimming is set at "1" to "9", all bands from "1" to "9" may be used in the test production stage while only a band from "4" to "6" is a sufficient adjustment range required in the mass production stage.

In this case, if optical fuses for programming "1" to "9" are arranged on the same Y-axis, trimming is completed with a single time of scanning in the X-axis direction regardless of whether it is the test production stage or the mass production stage.

However, there can be a case where the optical fuses cannot be arranged on the same Y-axis due to limitations of layout. In this case, it needs to arrange optical fuses on two or more Y-axes in a distributed manner (see Japanese Patent Application Laid-open H7-273200). However, if such an arrangement is applied, for example, despite the fact that the required adjustment range is as narrow as "4" to "6" in the mass production stage, the Y-coordinate of the optical fuses to blow is distributed to a first Y-coordinate and a second Y-coordinate, and this results in an increase of the trimming time that is the total blowing time of a plurality of optical fuses.

SUMMARY

In one embodiment, there is provided a semiconductor device that includes a first circuit and a plurality of optical fuses that store adjustment data to adjust characteristics of the first circuit. The optical fuses are grouped into at least first and second ladder fuses. The optical fuses belonging to the first ladder fuse are arranged at each intersection of a first Y-coordinate with a plurality of X-coordinates. The optical fuses belonging to the second ladder fuse are arranged at each intersection of a second Y-coordinate with a plurality of X-coordinates. When the adjustment data is within a first range, the adjustment data is represented by an output signal of the first ladder fuse in which at least one of the optical fuses is trimmed and an output signal of the second ladder fuse in which at least one of the optical fuses is trimmed. When the adjustment data is within a second range, the adjustment data is represented by the output signal of the first ladder fuse in which none of the optical fuses is trimmed and the output signal of the second ladder fuse in which at least one of the optical fuses is trimmed.

In one embodiment, there is provided a semiconductor device that includes: a first circuit; a first ladder fuse including a plurality of first optical fuses arranged along a first line; and a second ladder fuse including a plurality of second optical fuses arranged along a second line. The first and second ladder fuses store adjustment data that adjusts characteristics of the first circuit. The first and second lines are directed toward a first coordinate whereas second coordinates of the first and second lines are different from each other. The adjustment data is within a first range when at least one of the first optical fuses and at least one of the second optical fuses are a programmed state. The adjustment data is within a second range when none of the first optical fuses and at least one of the second optical fuses is the programmed state.

In another embodiment, there is provided a method of manufacturing a semiconductor device, that includes: providing a semiconductor wafer having first and second ladder fuses each including a plurality of optical fuses to store adjustment data that adjusts characteristics of a first circuit; and trimming the ladder fuses by scanning a laser irradiation position along an X-coordinate on the first ladder fuse and scanning the laser irradiation position along the X-coordinate on the second ladder fuse after changing a Y-coordinate of the laser irradiation position when the adjustment data is within a first range; and trimming the ladder fuses by scanning the laser irradiation position along the X-coordinate on the second ladder fuse without scanning the laser irradiation position along the X-coordinate on the first ladder fuse when the adjustment data is within a second range.

In another embodiment, there is provided a method of manufacturing a semiconductor device, that includes: providing first and second ladder fuses each including a plurality of optical fuses to store adjustment data that adjusts characteristics of a first circuit; when the adjustment data is within a first range, trimming at least one of the optical fuses included in the first ladder fuse by scanning a laser irradiation position in an X-direction with a Y-coordinate fixed to a first Y-coordinate, moving the Y-coordinate of the laser irradiation position from the first Y-coordinate to a second Y-coordinate, and trimming at least one of the optical fuses included in the second ladder fuse by scanning the laser irradiation position in the X-direction with the Y-coordinate fixed to the second Y-coordinate; and when the adjustment data is within a second range, trimming at least one of the optical fuses included in the second ladder fuse by scanning the laser irradiation position in the X-direction with the Y-coordinate fixed to the second Y-coordinate without trimming any one of the optical fuses included in the first ladder fuse.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

An embodiment of the present invention will be described below. It will be understood that what is claimed by the present invention is not limited to this embodiment and is set forth in the claims of the present invention. A technical concept of the embodiment of the present invention is that, when adjustment data for adjusting circuit characteristics is stored in a first ladder fuse and a second ladder fuse having a Y-coordinate different from each other, both the first and second ladder fuses are blown if it is necessary to use the adjustment data in a wide range, and the second ladder fuse is blown without blowing the first ladder fuse if the adjustment data is used in a narrow range. This makes it possible to shorten a trimming time that is a total blowing time of a plurality of optical fuses. For example, because it is not necessary to blow the first ladder fuse when it is enough to use the adjustment data in a substantially narrow range as in a mass production stage and to secure a selection range by blowing both the first and second ladder fuses when it is necessary to use the adjustment data in a wide range as in a test production stage.

Figure 1A:
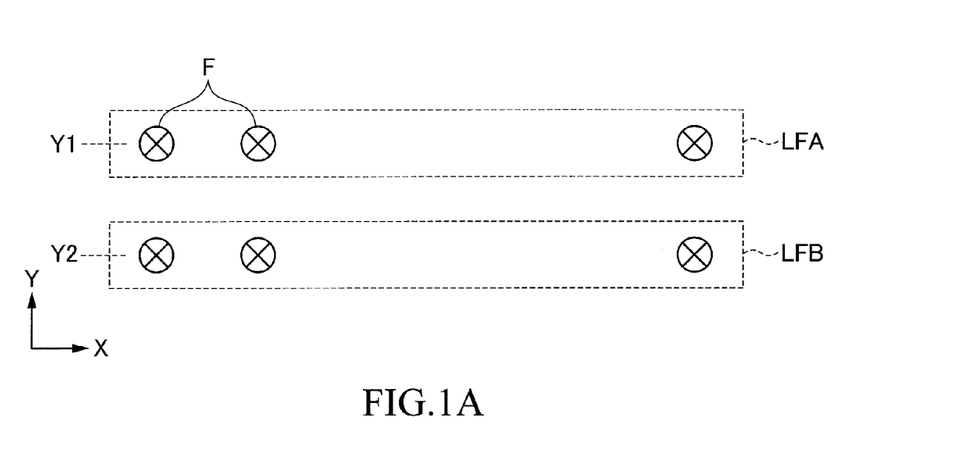
FIG. 1A is a schematic layout of optical fuses.

Referring now to FIG. 1A, a plurality of fuses F are used in the embodiment of the present invention, where one part of the fuses F constitutes a first ladder fuse LFA arranged at a first Y-coordinate (Y1), and the other part of them constitutes a second ladder fuse LFB arranged at a second Y-coordinate (Y2). The optical fuses F constituting the first ladder fuse LFA have an X-coordinate different from each other, and the optical fuses F constituting the second ladder fuse LFB also have an X-coordinate different from each other. In the present invention, the X-coordinate and the Y-coordinate are not meant to be absolute directions, but are sufficient as long as they are at right angles to each other.

Each of the optical fuses F is in an electrically conductive state in an initial state. Therefore, all of the optical fuses F are in the electrically conductive state when a front-end process of a semiconductor wafer is completed. Thereafter, if a laser irradiation is performed on the optical fuse F by a laser trimmer in a testing process of the semiconductor wafer, the optical fuse F transits from the electrically conductive state to an electrically nonconductive state. Such a transition cannot be restored to the original conductive state. Therefore, it is possible to store 1-bit information with one optical fuse F in an irreversible and nonvolatile manner. The information stored by using the optical fuse F is the adjustment data for adjusting circuit characteristics of a predetermined circuit included in a corresponding semiconductor device that is a semiconductor chip separated from the semiconductor wafer. That is, the predetermined circuit is adjusted to have desired characteristics by measuring the circuit characteristics of the predetermined circuit in the testing process of the manufacturing stage and programming the adjustment data in the optical fuse F based on the measurement result. Such a characteristic adjusting operation by the laser irradiation is called fuse trimming. Note that the semiconductor wafer can be read as the semiconductor device.

The fuse trimming is performed in a so-called on-the-fly method. The fuse trimming by the on-the-fly method is performed after adjusting or aligning positions of the laser irradiation position with respect to the semiconductor device on the semiconductor wafer. Therefore, when performing trimming by the on-the-fly method for the first ladder fuse LFA, a plurality of optical fuses F constituting the first ladder fuse LFA are selectively blown by moving the laser irradiation position in an X-axis direction in a state where the Y-coordinate is fixed to the first Y-coordinate (Y1) of the first ladder fuse LFA. Similarly, when performing trimming by the on-the-fly method for the second ladder fuse LFB, a plurality of optical fuses F constituting the second ladder fuse LFB are selectively blown by moving the laser irradiation position in the X-axis direction in a state where the Y-coordinate is fixed to the second Y-coordinate (Y2) of the second ladder fuse LFB. When the number of changing the on-the-fly coordinate from the first Y-coordinate (Y1) to the second Y-coordinate (Y2) increases, it is desirable to perform realignment in order to enhance the accuracy of a spot coordinate of the laser irradiation. The alignment is performed by adjusting positions of the laser irradiating device with respect to the semiconductor wafer based on an alignment mark (a layout pattern for alignment) on a chip or the semiconductor wafer. At the time of alignment, the laser trimmer can be moved with the semiconductor wafer as a reference, or the semiconductor wafer can be moved with the laser irradiating device as a reference.

Figure 1B:
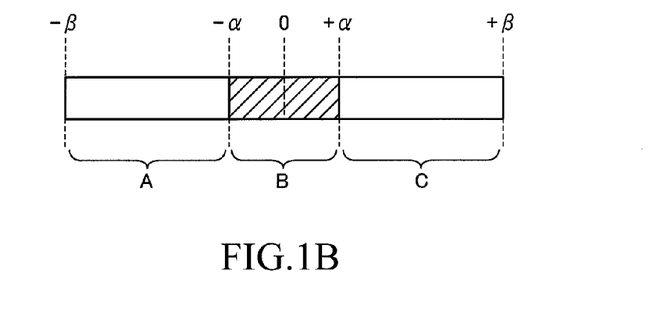
FIG. 1B is an adjustable range of adjustment data.

The first ladder fuse LFA is used for widely setting the adjustable range of adjustment data. Specifically, as shown in FIG. 1B, when the adjustable range of the adjustment data is A+B+C, both the first ladder fuse LFA and the second ladder fuse LFB are used. In this case, the adjustment data can be adjusted in a range of ±β. On the other hand, when the adjustable range of the adjustment data is limited to B, only the second ladder fuse LFB is used. In this case, the adjustment data can be adjusted in a range of ±α (where α<β. The notation of "0" in FIG. 1B means a characteristic value of the predetermined circuit obtained when none of the first ladder fuse LFA and the second ladder fuse LFB is blown, which matches a design value in an ideal case. However, because the characteristic value at "0" varies depending on a processing condition and the like, the fuse trimming is performed to bring the characteristic value close to the design value.

As a first example, when the manufacturing maturity level of the semiconductor device is low as in a test production stage, because the deviation between an actually obtained characteristic value and the design value is large, it is necessary to set the adjustable range of the adjustment data by the fuse trimming to a wide range. In this case, both the first and second ladder fuses LFA and LFB are used. On the other hand, when the manufacturing maturity level of the semiconductor device is high as in a mass production stage, in most cases, the deviation between the actually obtained characteristic value and the design value is small, and therefore it is not necessary to set the adjustable range of the adjustment data by the fuse trimming to a wide range, and for example, the range of ±α is enough for the adjustable range of the adjustment data. In this case, it is sufficient to perform the fuse trimming only on the second ladder fuse LFB without performing it on the first ladder fuse LFA.

Furthermore, as a second example, the same logic as the first example can be applied due to variations in manufacturing between semiconductor wafers or between semiconductor wafer lots. In the second example, for instance, one lot is defined by 25 semiconductor wafers. When the semiconductor wafers are processed in a manufacturing apparatus, the characteristics are different for each of the semiconductor wafers according to positions of the semiconductor wafers in the manufacturing apparatus. The same is true for the lots.

In this manner, when the range of ±α is enough for the adjustable range of the adjustment data, it is possible to shorten the trimming time, that is the total blowing time of a plurality of optical fuses, by allocating a relation between the adjustment data and the optical fuses F such that the adjustment data is generated by only the fuse trimming on the second ladder fuse LFB.

Figure 2:
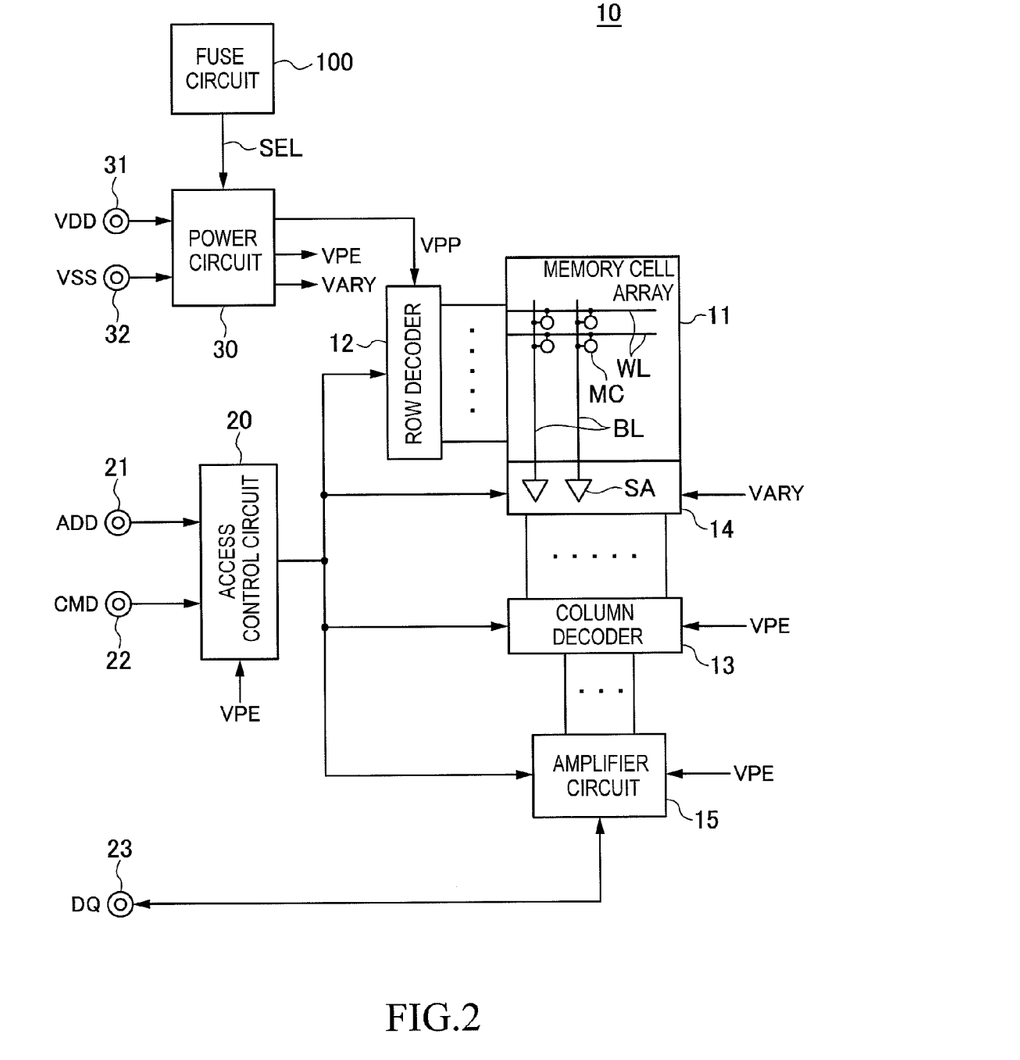
FIG. 2 is a block diagram showing an overall configuration of a semiconductor device according to an embodiment of the present invention.

Turning to FIG. 2, the semiconductor device 10 according to the present embodiment is a DRAM, which includes a memory cell array 11. The memory cell array 11 includes a plurality of word lines WL and a plurality of bit lines BL intersecting with each other, and memory cells MC are arranged at intersection of the word lines WL and the bit lines BL. A word line WL is selected by a row decoder 12, and a bit line BL is selected by a column decoder 13. Each of the bit lines BL is connected to a corresponding sense amplifier SA in a sense circuit 14. The bit line BL selected by the column decoder 13 is connected to an amplifier circuit 15 via the sense amplifier SA.

The row decoder 12, the column decoder 13, the sense circuit 14, and the amplifier circuit 15 are controlled by an access control circuit 20. The access control circuit 20 receives an address signal ADD and a command signal CMD externally supplied via an address terminal 21 and a command terminal 22, respectively. The access control circuit 20 controls the row decoder 12, the column decoder 13, the sense circuit 14, and the amplifier circuit 15 based on these signals.

Specifically, when the command signal CMD indicates an active operation of the semiconductor device 10, the address signal ADD is supplied to the row decoder 12. The row decoder 12 selects a word line WL indicated by the address signal ADD. The memory cells MC corresponding to the selected word line WL are connected to the respective bit lines BL. Thereafter, the access control circuit 20 activates the sense circuit 14 at a predetermined timing.

On the other hand, when the command signal CMD indicates a reading operation or a writing operation of the semiconductor device 10, the address signal ADD is supplied to the column decoder 13. The column decoder 13 connects the bit line BL indicated by the address signal ADD to the amplifier circuit 15. In the reading operation, read data DQ read from the memory cell array 11 via the sense amplifier SA is output to outside from a data terminal 23 via the amplifier circuit 15. In the writing operation, write data DQ supplied from outside via the data terminal 23 is written in the memory cell MC via the amplifier circuit 15 and the sense amplifier SA.

Each of these circuit blocks uses a predetermined internal voltage as its operation power. The internal voltage is generated by a power circuit 30 shown in FIG. 2. The power circuit 30 receives an external potential VDD and a ground potential VSS respectively supplied via power source terminals 31 and 32, and generates internal voltages VPP, VPE, VARY and the like based on the received potentials. In the present specification, each of VDD, VPP, VPE, and VARY indicates a potential difference or a voltage with respect to the ground potential VSS, as well as indicating levels of respective potentials. For example, "VDD" indicates a potential difference or a voltage with respect to the ground potential VSS, as well as indicating a potential level of the external potential VDD. The same is true for VPP, VPE, and VARY. In the present embodiment, a relation of VPP>VDD>VPE≅VARY is established. The internal potential VPP is generated by stepping up the external potential VDD, and the internal voltages VPE and VARY are generated by stepping down the external voltage VDD.

The internal voltage VPP is mainly used in the row decoder 12. The row decoder 12 drives the word line WL selected based on the address signal ADD to the VPP level, thereby switching on or conducting a cell transistor included in the memory cell MC. The internal voltage VARY is used in the sense circuit 14. When the sense circuit 14 is activated, the read data is amplified by driving one of a pair of bit lines to the VARY level and the other of the pair to the VSS level. The internal voltage VPE is used as an operation voltage of most peripheral circuits including the access control circuit 20. By using the internal voltage VPE lower than the external voltage VDD as the operation voltage of these peripheral circuits, power consumption of the semiconductor device 10 is suppressed.

The levels of various internal voltages generated by the power circuit 30 are adjusted by a fuse circuit 100. The power circuit 30 according to the present embodiment may be referred to as "first circuit". In the following explanations, an operation of adjusting an internal voltage VA (not shown in FIG. 2) generated by the power circuit 30 is explained.

Figure 3:
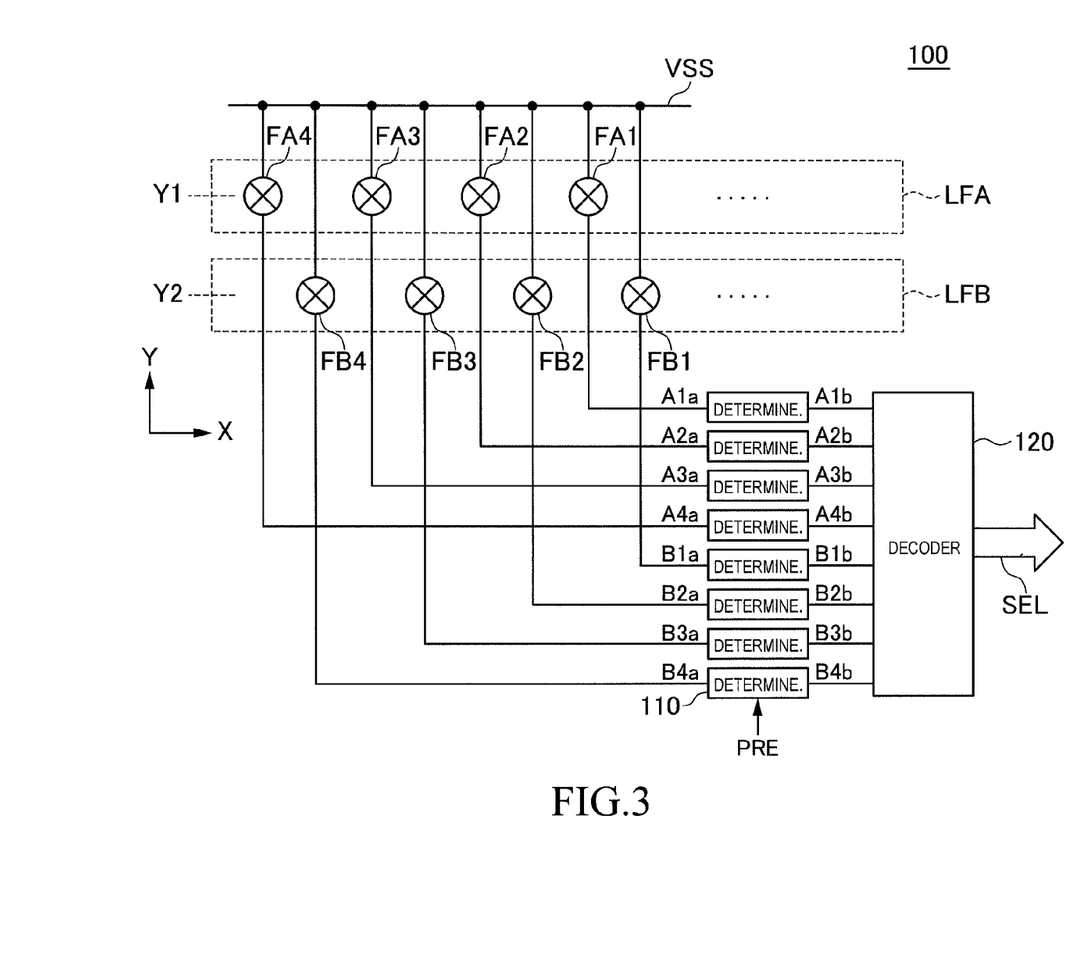
FIG. 3 is a schematic diagram of a configuration of the fuse circuit shown in FIG. 2.

Turning to FIG. 3, the fuse circuit 100 includes the first ladder fuse LFA and the second ladder fuse LFB each constituted by a plurality of optical fuses, a determination circuit 110 that determines the state of each of the optical fuses, and a decoder 120 that decodes an output signal supplied from the determination circuit 110.

The first ladder fuse LFA is constituted by a plurality of optical fuses FA1, FA2, . . . arranged at the first Y-coordinate (Y1), and the second ladder fuse LFB is constituted by a plurality of optical fuses FB1, FB2, . . . arranged at the second Y-coordinate (Y2). The central coordinate of each of the optical fuses corresponds to a blowing point at the time of trimming. Therefore, when laser trimming is performed on the first ladder fuse LFA, the optical fuses FA1, FA2, . . . that constitute the first ladder fuse LFA are selectively blown while moving or shifting the laser irradiation position in the X-axis direction with the Y-coordinate fixed at the first Y-coordinate (Y1) of the first ladder fuse LFA. Similarly, when laser trimming is performed on the second ladder fuse LFB, the optical fuses FB1, FB2, . . . that constitute the second ladder fuse LFB are selectively blown while moving or shifting the laser irradiation position in the X-axis direction with the Y-coordinate fixed at the second Y-coordinate (Y2) of the second ladder fuse LFB.

In the present embodiment, the X-coordinates of blowing points of the optical fuses FA1, FA2, . . . that constitute the first ladder fuse LFA are respectively shifted from the X-coordinates of blowing points of the optical fuses FB1, FB2, . . . that constitute the second ladder fuse LFB. This leads to a layout shown in FIG. 3 in which the optical fuses are arranged in a zigzag manner as a whole. With this layout, it is possible to respectively separate the distance between the optical fuses FA1, FA2, . . . that constitute the first ladder fuse LFA and the optical fuses FB1, FB2, . . . that constitute the second ladder fuse LFB. Accordingly, it is possible to decrease the pitch of the optical fuses FA1, FA2, . . . and the pitch of the optical fuses FB1, FB2, . . . , which makes it possible to reduce an occupying area of the fuse circuit 100. However, such a layout in a zigzag manner is not essential in the present invention.

One terminal of each of the optical fuses is commonly connected to a VSS wiring, and the other terminal is connected to a corresponding determination circuit 110. The VSS wiring is a wiring to which the ground potential VSS is supplied. With this arrangement, fuse signals A1a to A4a and B1a to B4a supplied to each determination circuit 110 become the VSS level if the corresponding optical fuse F is in a non-blown state or conductive state, and become a floating state if the corresponding optical fuse F is in a blown state or nonconductive state. A precharge signal PRE is commonly supplied to each determination circuit 110, as well as the above fuse signals, and it is determined whether the corresponding optical fuse is blown based on a change of the precharge signal PRE. Determination signals A1b to A4b and B1b to B0b generated by the determination circuit 110 are supplied to the decoder 120. The decoder 120 generates a selection signal SEL by decoding the determination signals A1b to A4b and B1b to B4b. The selection signal SEL is supplied to the power circuit 30 shown in FIG. 2, and the levels of the various internal voltages are adjusted according to the value of the selection signal SEL.

A circuit diagram of the determination circuit 110 will be explained in reference to FIG. 4. Although the determination circuit 110 shown in FIG. 4 is corresponding to the optical fuse FA1, determination circuits 110 corresponding to other optical fuses have the same circuit configuration.

Figure 4:
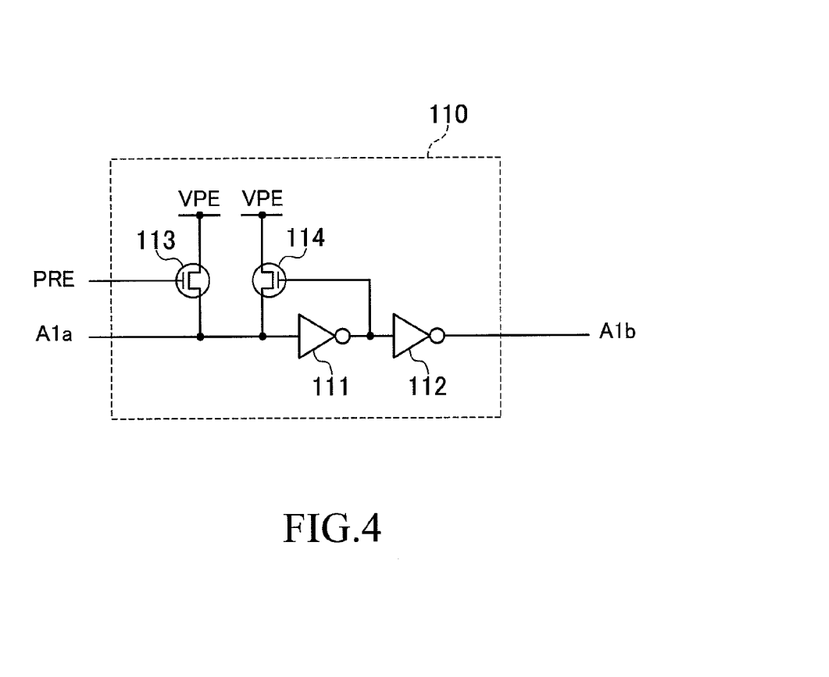
FIG. 4 is a circuit diagram of the determination circuit shown in FIG. 3.

As shown in FIG. 4, the determination circuit 110 includes two-stage inverters 111 and 112 that receive the fuse signal A1a and generate the determination signal A1b and P-channel MOS transistors 113 and 114 connected between a VPE wiring and an input node of the inverter 111. The precharge signal PRE is supplied to a gate electrode of the transistor 113, and an output signal of the inverter 111 is supplied to a gate electrode of the transistor 114.

Figure 5:
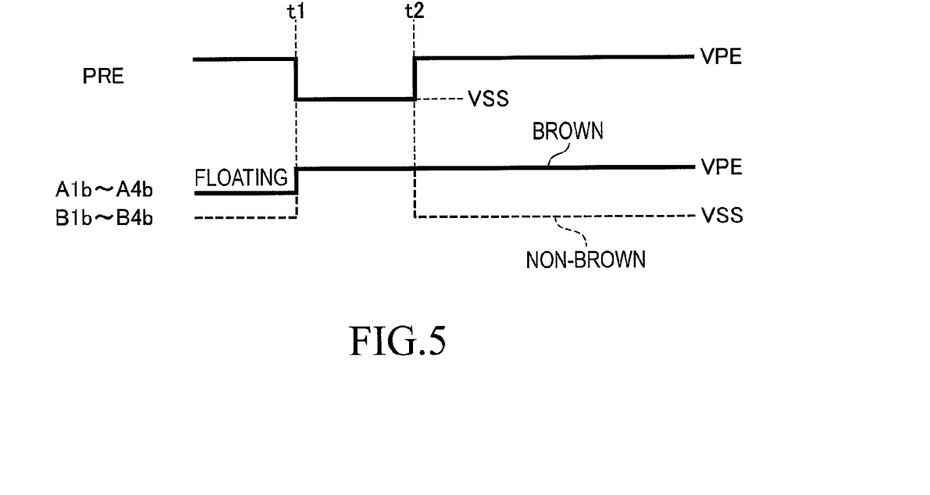
FIG. 5 is an operation waveform diagram for explaining an operation of the determination circuit shown in FIG. 4.

Turning to FIG. 5, the precharge signal PRE is a high level before a time t1, so that the transistor 113 is in an off state. Therefore, each of the fuse signals A1a to A4a and B1a to B4a becomes a VSS level if the corresponding optical fuse F is in a non-blown state, and becomes a floating state if the corresponding optical fuse F is in a blown state.

When the pre-charge signal PRE is changed to a low level at the time t1, the transistor 113 is switched on, and thus the level of each of the fuse signals A1a to A4a and B1a to B4a is precharged to a high level (VPERI) regardless of the state of the corresponding optical fuse. Thereafter, when the precharge signal PRE is returned to a high level at a time t2, the transistor 113 returns to the off state again. As a result, each of the fuse signals A1a to A4a and B1a to B4a is returned to the VSS level if the corresponding optical fuse is in a non-blown state, and maintains a high level (VPERI) if the corresponding optical fuse F is in a blown state. The high level (VPERI) can be either the internal voltage VPE or the external potential VDD.

The level of each of the fuse signals A1a to A4a and B1a to B4a is latched by a latch circuit constituted by the inverter 111 and the transistor 114 of the determination circuit 110, and output as the determination signals A1b to A4b and B1b to B0b. The determination signals A1b to A4b and B1b to B4b are supplied to the decoder 120.

Figure 6:
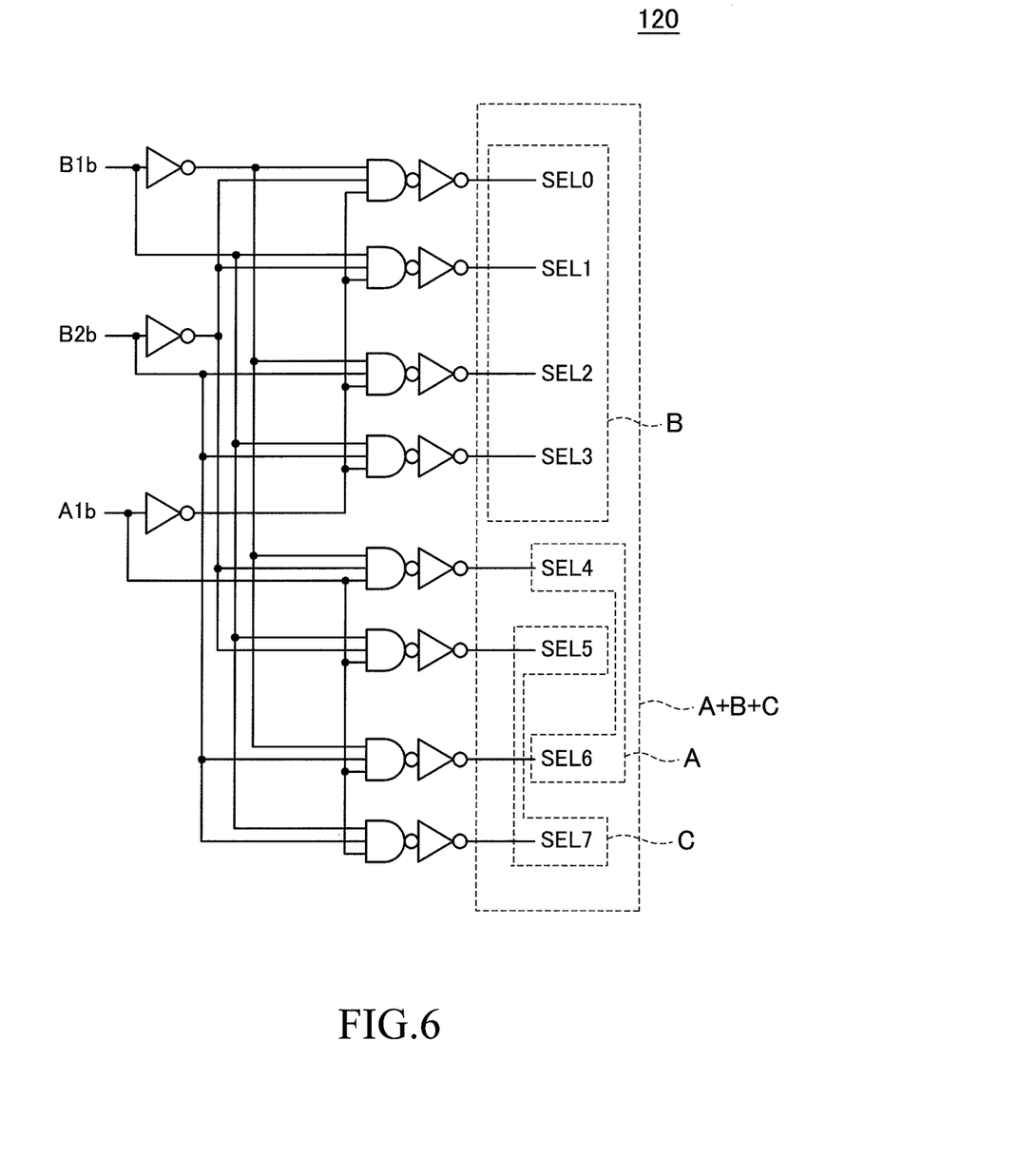
FIG. 6 is a circuit diagram showing a configuration of main parts of the decoder shown in FIG. 3.

Turning to FIG. 6, FIG. 6 shows a circuit part that decodes the determination signals A1b, B1b, and B2b as a part of a circuit that constitutes the decoder 120, which activates any one bit of 8-bit selection signals SEL0 to SEL7 to a high level according to a combination of the determination signals A1b, B1b, and B2b. The selection signals SEL0 to SEL3 represented as B in FIG. 6 indicates a signal group that can be activated when the determination signal A1b is a low level. In other words, these signals are a signal group that can be activated when the optical fuse FA1 is in a non-blown state. A voltage adjustable range by the signal group B corresponds to an adjustable range B shown in FIG. 1B.

Meanwhile, the selection signals SEL4 to SEL7 represented as A or C in FIG. 6 indicate a signal group that can be activated when the determination signal A1b is a high level. In other words, these signals are a signal group that can be activated when the optical fuse FA1 is in a blown state. A voltage adjustable range by the signal groups A and C corresponds to adjustable ranges A and C shown in FIG. 1B, respectively.

Figure 7:
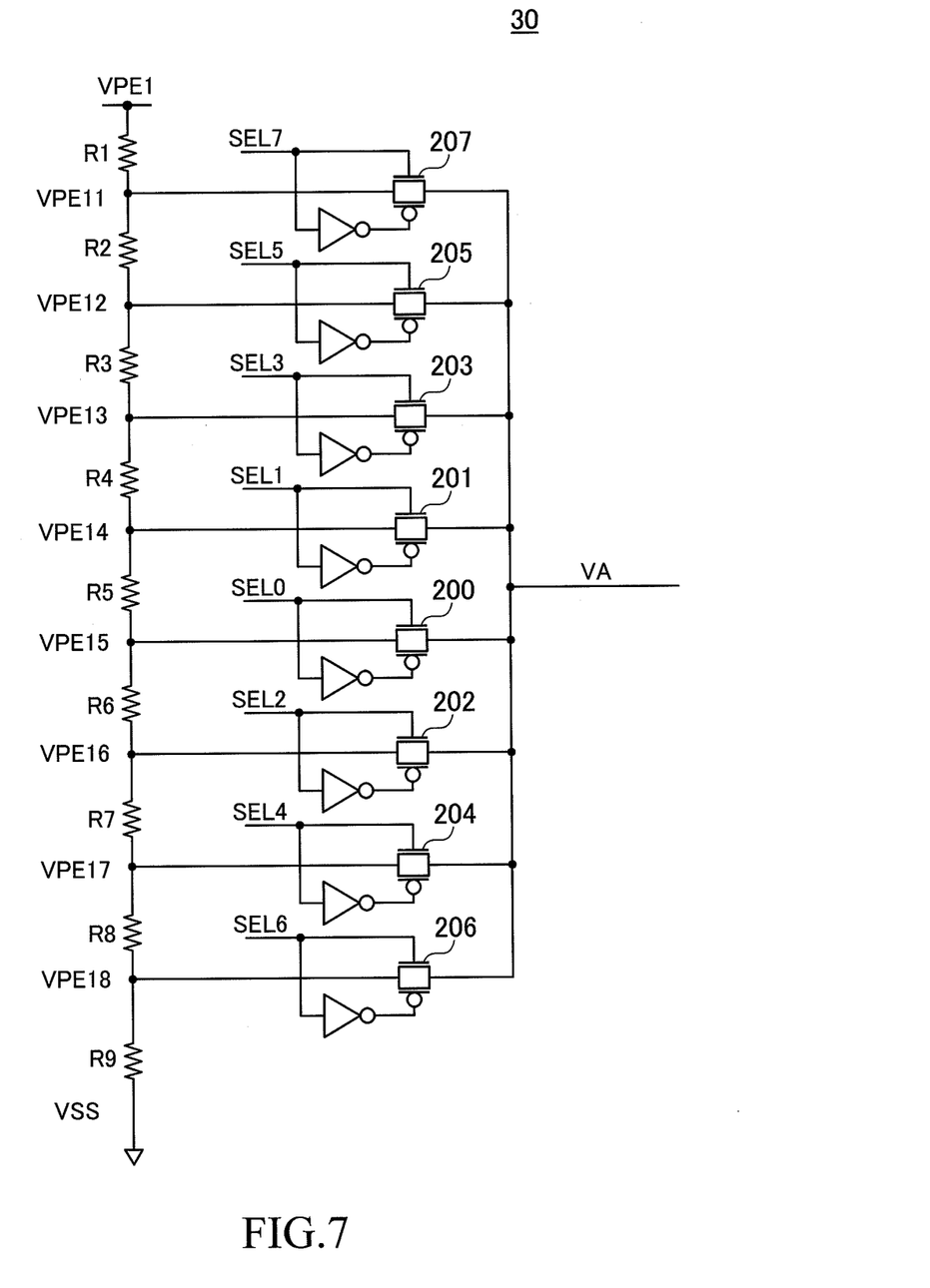
FIG. 7 is a circuit diagram showing a configuration of a part of main parts of the power circuit shown in FIG. 2.

Turning to FIG. 7, FIG. 7 shows a circuit part that generates a predetermined internal voltage VA as a part of a circuit that constitutes the power circuit 30. This circuit part shows an internal voltage VA as a reference voltage that is supplied to, for example, an operational amplifier (not shown) that controls a known regulator (not shown) included in the power circuit 30. The circuit part shown in FIG. 7 includes nine resistor elements R1 to R9 connected in series between a power supply potential VPE1 and the ground potential VSS and transfer gates 200 to 207 that select any one of internal voltages VPE11 to VPE18 generated by the resistor elements. The power source potential VPE1 corresponds to the internal voltage VPE output from the power circuit 30 shown in FIG. 2.

The level of the internal voltage VPE11 is given by the following equation.

$$VPE11 = \frac{(R2 + R3 + R4 + R5 + R6 + R7 + R8 + R9) \times VPE1}{R1 + R2 + R3 + R4 + R5 + R6 + R7 + R8 + R9} \quad \text{Equation 1}$$

The level of the internal voltage VPE15 is given by the following equation.

$$VPE15 = \frac{(R6 + R7 + R8 + R9) \times VPE1}{R1 + R2 + R3 + R4 + R5 + R6 + R7 + R8 + R9} \quad \text{Equation 2}$$

The level of the internal voltage VPE18 is given by the following equation.

$$VPE18 = \frac{R9 \times VPE1}{R1 + R2 + R3 + R4 + R5 + R6 + R7 + R8 + R9} \quad \text{Equation 3}$$

The levels of other internal voltages are given by similar equations. As a result, a relation between the internal voltages VPE11 to VPE18 becomes VPE11>VPE12>VPE13 . . . VPE17>VPE18. The resistance of the resistor elements R1 to R9 can be set arbitrarily.

Meanwhile, the transfer gates 200 to 207 are conducted based on corresponding ones of the selection signals SEL0 to SEL7, respectively. Therefore, only one of the transfer gates 200 to 207 becomes a conductive state, and any one of the internal voltages VPE11 to VPE18 corresponding to the conducted transfer gate is output as the internal voltage VA.

Figure 8:
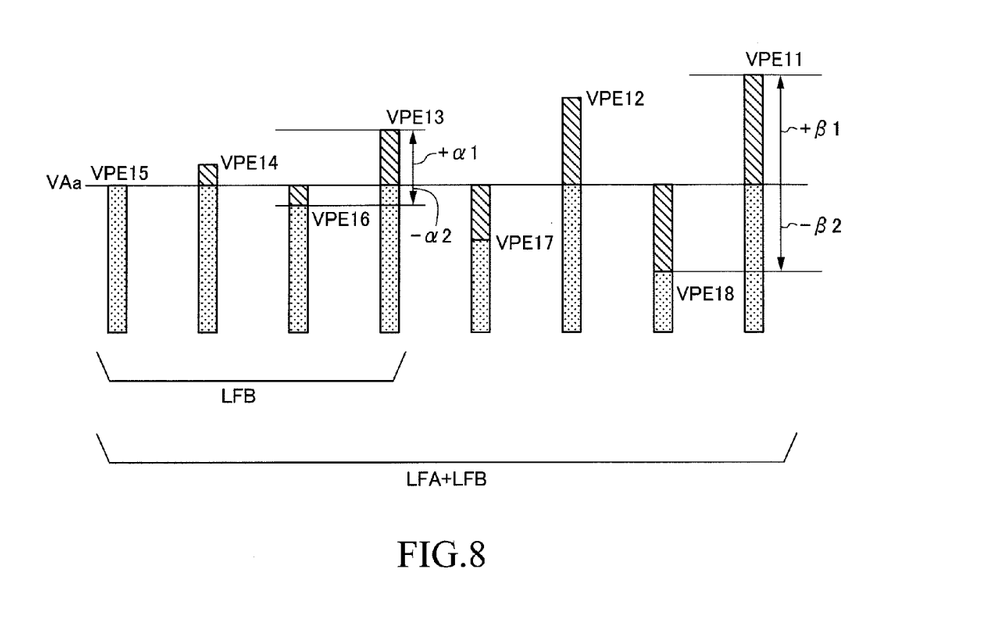
FIG. 8 is a schematic diagram for explaining a level adjustment of the internal voltage VA performed by a fuse trimming.
Figure 9:
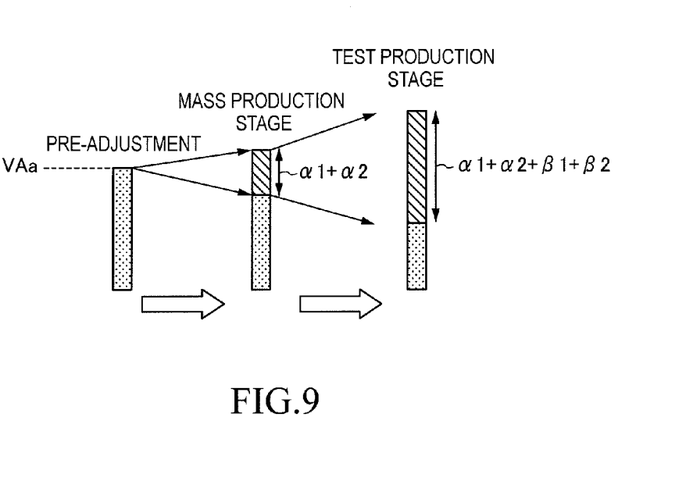
FIG. 9 is a schematic diagram for explaining a relation between an adjustable range of the internal voltage VA in a test production stage and an adjustable range of the internal voltage VA in a mass production stage.

Turning to FIGS. 8 and 9, a line represented by VAa is a reference level of the internal voltage VA that is actually obtained, and a hatched portion represents an adjustment amount of the voltage by trimming. As shown in FIG. 8, when the adjustment range of the voltage by the trimming is set to a range of +α1 to −α2, any one of the internal voltages VPE13 to VPE16 is selected. On the other hand, when the adjustable range of the voltage by the trimming is expanded to a range of +β1 to −β2, any one of the internal voltages VPE11 to VPE18 is selected.

In a case of selecting any one of the internal voltages VPE13 to VPE16, that is, when the adjustable range is set to the range of +α1 to −α2, it is sufficient to activate an arbitrary selection signal among the selection signals SEL0 to SEL3, and the other selection signals SEL4 to SEL7 do not need to be activated. Because it means that the selection signals SEL0 to SEL3 to be used are set to the signal group B as explained with FIG. 6, the optical fuse FA1 can be constantly in a non-blown state. As a result, in actual trimming, it is sufficient to perform the trimming on the second ladder fuse LFB shown in FIG. 3, which eliminates the necessity for performing the trimming on the first ladder fuse LFA.

On the other hand, in a case of expanding the selectable range of the internal voltage to the internal voltages VPE11 to VPE18, that is, when the adjustment range is expanded to the range of +β1 to −β2, the trimming can be performed on both the first and second ladder fuses LFA and LFB according to the contents to be programmed.

This configuration means that, among the 3-bit of determination signals A1b, B1b, and B2b, the determination signal A1b constitutes an upper bit of a binary signal, and the determination signals B1b and B2b constitute lower bits of the binary signal.

Therefore, for example, when the manufacturing maturity level of the semiconductor device is low as in a test production stage, both the first and second ladder fuses LFA and LFB are used because it is necessary to set the adjustable range of the internal voltage VA widely, whereas when the manufacturing maturity level of the semiconductor device is high as in a mass production stage, it is enough to use only the second ladder fuse LFB. This makes it possible to secure a wide adjustable range of the internal voltage VA in the test production stage, and at the same time, it possible to shorten a trimming time (a total blowing time of a plurality of optical fuses) when the adjustable range of the internal voltage VA can be limited as in the mass production stage because the first ladder fuse LFA does not need to be blown.

A case of performing trimming on a semiconductor wafer is explained next. The semiconductor wafer is constituted by a plurality of chips arranged in a matrix form in an X-direction and a Y-direction. Each of the chips includes first and second ladder fuses. All of the chips are tested on the semiconductor wafer. After the test, a laser trimmer blows the first and second ladder fuses of each of the chips based on a corresponding test result. When test results or adjustment data of a plurality of chips arranged in the X-direction with the common Y-direction (first X array) on the semiconductor wafer are all within a second range, the laser trimmer blows only the second ladder fuses for the first X array. On the other hand, test results or adjustment data of at least one of the chips included in the first X array are within a first range, the laser irradiating device moves to a Y-axis of the first ladder fuse and blows the first ladder fuse included in the corresponding at least one of the chips for the first X array, and thereafter moves to a Y-axis of the second ladder fuse and blows the second ladder fuse. The same process is performed for a plurality of chips arranged in a second X array and a third X array.

Figure 10:
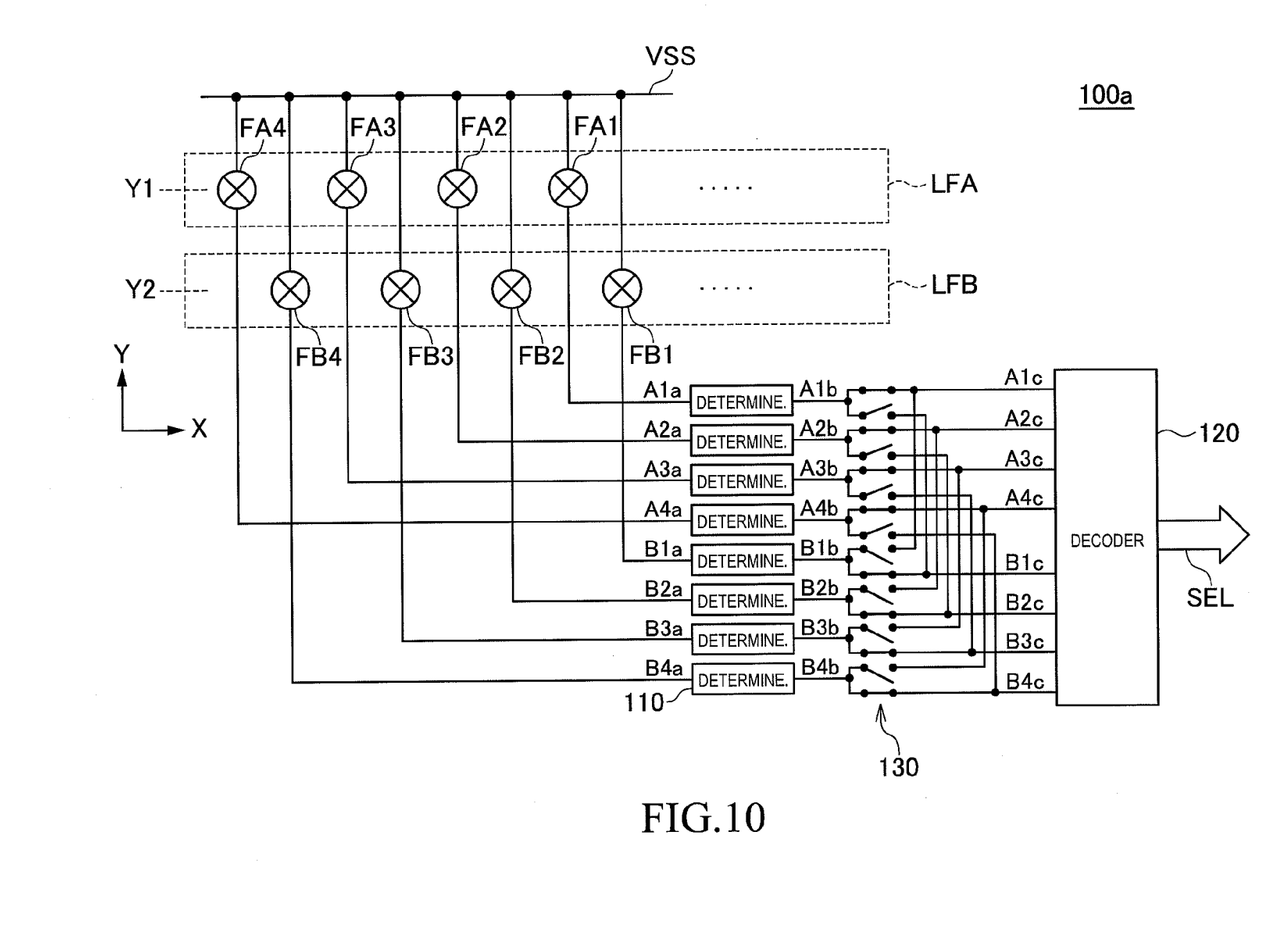
FIG. 10 is a circuit diagram of a fuse circuit according to a modification of the embodiment.

Turning to FIG. 10, the fuse circuit 100a is different from the fuse circuit 100 shown in FIG. 3 in that a switch 130 is provided between the determination circuit 110 and the decoder 120. Other features of the fuse circuit 100a are identical to those of the fuse circuit 100 shown in FIG. 3, and therefore like elements are denoted by like reference numerals and redundant explanations thereof will be omitted.

The switch 130 performs switching of determination signals output from the determination circuit 110. Specifically, the switch 130 selects whether to output the determination signals Aib and the determination signals Bib (where i is 1 to 4) as these signals are as determination signals Aic and determination signals Bic, respectively, or to output these signals as the determination signals Bic and the determination signals Aic in a reversed manner, respectively. In an example shown in FIG. 10, there is shown a state where the determination signals A1b to A4b and B1b to B4b are output as these signals are as the determination signals A1c to A4c and B1c to B4c.

By providing the switch 130 described above, it is possible to switch allocations of the determination signals A1c to A4c and B1c to B4c input to the decoder 120 between the first ladder fuse LFA and the second ladder fuse LFB. This makes it possible to, for example, when the adjustable range of the internal voltage VA is limited in a mass production stage, eliminate the necessity of blowing the first ladder fuse LFA in any limited range, by performing switching of the switch 130 according to an actual limited range.

Although the specific configuration of the switch 130 is not particularly limited, it is possible to achieve the functions of the switch 130 by changing a mask pattern. In this case, when making a shift from the test production stage to the mass production stage, a wiring layer constituting the switch 130 can be changed according to how the adjustable range is limited.

Figure 11:
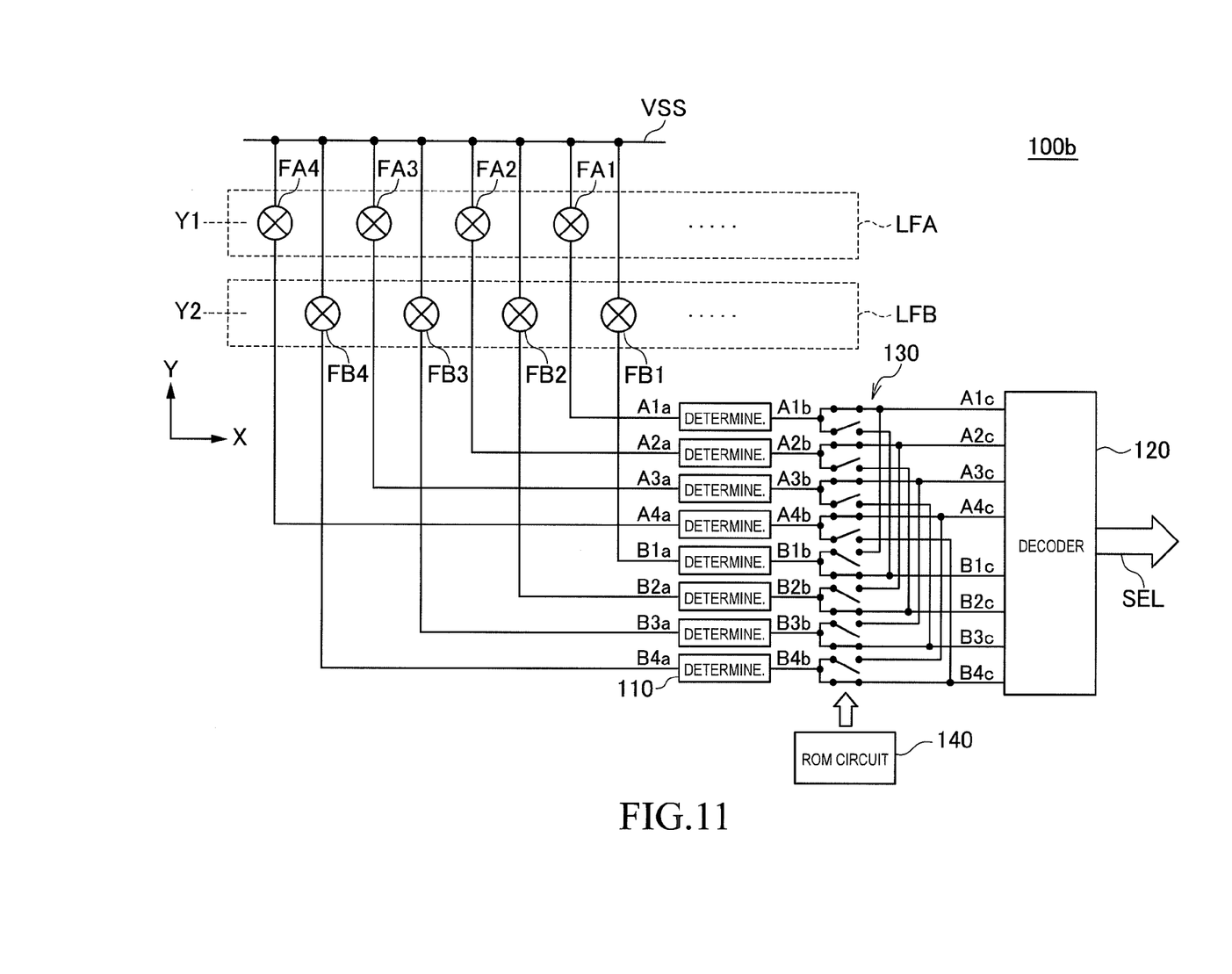
FIG. 11 is a circuit diagram of a fuse circuit according to another modification of the embodiment.

Alternatively, as a fuse circuit 100b shown in FIG. 11, a ROM circuit 140 that controls the switch 130 can be provided. For example, as the ROM circuit 140, an electrically writable antifuse circuit can be used. Using the ROM circuit 140 eliminates the necessity of changing the mask pattern.

It is apparent that the present invention is not limited to the above embodiments, but may be modified and changed without departing from the scope and spirit of the invention.

Figure 12:
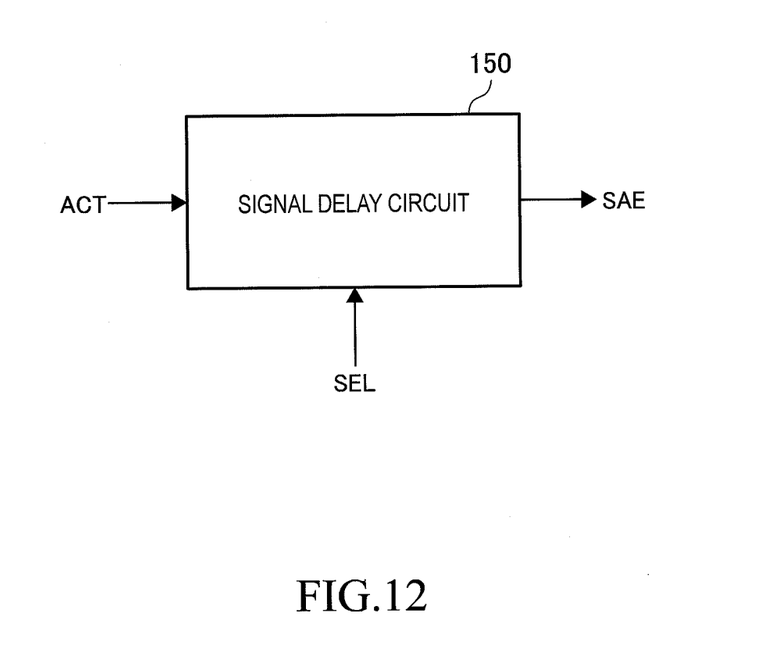
FIG. 12 is a block diagram showing the signal delay circuit.

For example, although a case where a target of the adjustment is the level of the internal voltage has been explained in the above embodiment as an example, the target of the adjustment by trimming is not limited to the level of the internal voltage in the present invention, and the present invention can be also applied to trimming for adjusting other parameters. For example, the present invention can be also applied to trimming for changing a time difference (a delay amount) between a first signal and a second signal in the access control circuit 20. As shown in FIG. 12, for example, the first signal is a signal ACT for activating the word line WL and the second signal is a signal SAE for activating the sense amplifier SA. The signal ACT is supplied to the signal delay circuit 150 to generate the signal SAE. The delay amount of the signal delay circuit 150 can be adjusted based on the selection signals SEL that is output from the fuse circuit 100.

While a case where adjustment data is programmed in a binary format has been explained in the above embodiment as an example, it is not essential to perform the programming of adjustment data with a binary format, and the programming can be performed such that adjustment data is changed by one pitch each time an optical fuse is blown.

In the fuse circuit 100, the determination circuit 110 can be formed in various circuit formats. In addition, it is also possible that only one determination circuit is used for the first and second ladder fuses LFA and LFB.

In the ROM circuit 140, an optical fuse for controlling the switch 130 can be provided in the second ladder fuse LFB instead of an antifuse circuit. This is because the second ladder fuse LFB is applied both in the test production stage and the mass production stage.

In the on-the-fly method, for a first chip and a second chip having the same first Y-coordinate (Y1) on a semiconductor wafer, it is possible to program the second ladder fuse LFB included in the first chip and the second ladder fuse LFB included in the second chip in a consecutive manner. That is, it is not necessary to move the Y-coordinate for each of the chips, and for example, it is possible to perform scanning in the X-direction and blowing of the optical fuse in a collective manner for a plurality of chips arranged in the X-direction.

In addition, while two ladder fuses having a Y-axis different from each other have been explained in the above embodiment as an example, three or more ladder fuses can be also used. For example, as a first case, three ladder fuses having a Y-axis different from one another (a first ladder fuse to a third ladder fuse) are provided, the three ladder fuses are blown in the test production stage, and one ladder fuse (the third ladder fuse) or two ladder fuses (the second and third ladder fuses) are blown in the mass production stage. As a second case, four ladder fuses (a first ladder fuse to a fourth ladder fuse) are provided, the four ladder fuses are blown in the test production stage, and two ladder fuses (the third and fourth ladder fuses) are blown in the mass production stage. In both cases, the movement of the Y-coordinate of the laser irradiating device can be reduced, which makes it possible to shorten the trimming time (the total blowing time of a plurality of optical fuses). It is matter of course that the first and second cases are included in the technical scope of the present application.

Fuse trimming by the on-the-fly method can be either a first method in which the laser irradiation position is moved with the semiconductor wafer as a reference (as it is fixed) or a second method in which the semiconductor wafer is moved with the laser irradiation position as a reference (as it is fixed). For example, the expression of "scanning the laser irradiation position in the X-direction" in the present specification means that the first method is substantially the same as the second method. Therefore, it is matter of course that both methods are included in the technical scope of the present application.

The technical concept of the present application can be applied to any semiconductor devices including an optical fuse. Furthermore, the circuit format in each circuit block disclosed in the drawings and other circuits that generate control signals are not limited to the circuit format disclosed in the above embodiment.

The technical idea of the present application can be applied to a semiconductor device having optical fuses. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
 a first circuit; and
 a plurality of optical fuses that store adjustment data to adjust characteristics of the first circuit, wherein
 the optical fuses are grouped into at least first and second ladder fuses,
 the optical fuses belonging to the first ladder fuse are arranged at each intersection of a first Y-coordinate with a plurality of X-coordinates,
 the optical fuses belonging to the second ladder fuse are arranged at each intersection of a second Y-coordinate with a plurality of X-coordinates,
 when the adjustment data is within a first range, the adjustment data is represented by an output signal of the first ladder fuse in which at least one of the optical fuses is trimmed and an output signal of the second ladder fuse in which at least one of the optical fuses is trimmed, and
 when the adjustment data is within a second range, the adjustment data is represented by the output signal of the first ladder fuse in which none of the optical fuses is trimmed and the output signal of the second ladder fuse in which at least one of the optical fuses is trimmed.

2. The device as claimed in claim 1, wherein the first range is wider than the second range.

3. The device as claimed in claim 1, wherein
 the first ladder fuse is allocated to an upper bit of the adjustment data, and
 the second ladder fuse is allocated to a lower bit of the adjustment data.

4. The device as claimed in claim 1, further comprising a switch unit that selects whether to allocate each of a plurality of bits constituting the adjustment data to the first ladder fuse or to the second ladder fuse.

5. The device as claimed in claim 4, further comprising a ROM circuit that controls the switch unit.

6. The device as claimed in claim 1, wherein the optical fuses belonging to the first ladder fuse and the optical fuses belonging to the second ladder fuse are arranged at different X-coordinates.

7. The device as claimed in claim 1, further comprising a second circuit that determines whether the optical fuses are trimmed, wherein the second circuit generates the adjustment data based on a determination result.

8. The device as claimed in claim 1, wherein
the first circuit is a power circuit, and
the adjustment data is used to adjust a voltage supplied from the power circuit.

9. A semiconductor device comprising:
a first circuit;
a first ladder fuse including a plurality of first optical fuses arranged along a first line; and
a second ladder fuse including a plurality of second optical fuses arranged along a second line, wherein
the first and second ladder fuses store adjustment data that adjusts characteristics of the first circuit,
the first and second lines are directed toward a first coordinate whereas second coordinates of the first and second lines are different from each other,
the adjustment data is within a first range when at least one of the first optical fuses and at least one of the second optical fuses are a programmed state, and
the adjustment data is within a second range when none of the first optical fuses and at least one of the second optical fuses is the programmed state.

10. The device as claimed in claim 9, wherein the first range is wider than the second range.

11. The device as claimed in claim 9, wherein
the first ladder fuse is allocated to an upper bit of the adjustment data, and
the second ladder fuse is allocated to a lower bit of the adjustment data.

12. The device as claimed in claim 9, further comprising a switch unit that selects whether to allocate each of a plurality of bits constituting the adjustment data to the first ladder fuse or second ladder fuse.

13. The device as claimed in claim 12, further comprising a ROM circuit that controls the switch unit.

14. The device as claimed in claim 9, wherein the first optical fuses and the second optical fuses are arranged at different first coordinates.

15. The semiconductor device as claimed in claim 9, further comprising a second circuit that determines whether the first and second optical fuses are the programmed state,
wherein the second circuit generates the adjustment data based on a determination result.

16. The semiconductor device as claimed in claim 15, wherein the second circuit includes a plurality of determination circuits each determines whether an associated one of the first and second optical fuses is the programmed state.

17. The semiconductor device as claimed in claim 9, wherein
the first circuit is a power circuit, and
the adjustment data is used to adjust a voltage supplied from the power circuit.

18. The semiconductor device as claimed in claim 9, wherein
the first circuit is a signal delay circuit, and
the adjustment data is used to adjust a delay amount of the signal delay circuit.

19. A method of manufacturing a semiconductor device, comprising:
providing a semiconductor wafer having first and second ladder fuses each including a plurality of optical fuses to store adjustment data that adjusts characteristics of a first circuit; and
trimming the optical fuses by scanning a laser irradiation position along an X-coordinate on the first ladder fuse and scanning the laser irradiation position along the X-coordinate on the second ladder fuse after changing a Y-coordinate of the laser irradiation position when the adjustment data is within a first range; and
trimming the optical fuses by scanning the laser irradiation position along the X-coordinate on the second ladder fuse without scanning the laser irradiation position along the X-coordinate on the first ladder fuse when the adjustment data is within a second range.

20. The method as claimed in claim 19, wherein the first range is wider than the second range.

21. The method as claimed in claim 19, wherein
the semiconductor wafer includes a plurality of semiconductor chips each having the first and second ladder fuses and the first circuit,
the semiconductor chips are arranged in a matrix in an X-direction and a Y-direction, and
the scanning the laser irradiation position along the X-coordinate is performed at one time with respect to the chips arranged in the X-direction.

22. The method as claimed in claim 21, wherein the changing the Y-coordinate of the laser irradiation position is performed at one time with respect to the chips arranged in the X-direction.

23. A method of manufacturing a semiconductor device, comprising:
providing first and second ladder fuses each including a plurality of optical fuses to store adjustment data that adjusts characteristics of a first circuit;
when the adjustment data is within a first range,
trimming at least one of the optical fuses included in the first ladder fuse by scanning a laser irradiation position in an X-direction with a Y-coordinate fixed to a first Y-coordinate,
moving the Y-coordinate of the laser irradiation position from the first Y-coordinate to a second Y-coordinate, and
trimming at least one of the optical fuses included in the second ladder fuse by scanning the laser irradiation position in the X-direction with the Y-coordinate fixed to the second Y-coordinate; and
when the adjustment data is within a second range, trimming at least one of the optical fuses included in the second ladder fuse by scanning the laser irradiation position in the X-direction with the Y-coordinate fixed to the second Y-coordinate without trimming any one of the optical fuses included in the first ladder fuse.

24. The method as claimed in claim 23, wherein the first range is wider than the second range.

* * * * *